(12) United States Patent
Sun et al.

(10) Patent No.: US 11,079,622 B2
(45) Date of Patent: Aug. 3, 2021

(54) DISPLAY PANEL HAVING REFLECTORS IN LIGHT ADJUSTING LAYER AND DRIVE METHOD THEREOF

(71) Applicant: BOE TECHNOLOGY GROUP CO., LTD., Beijing (CN)

(72) Inventors: Haiyan Sun, Beijing (CN); Hao Miao, Beijing (CN); Rui Li, Beijing (CN); Pengju Zhang, Beijing (CN); Hong Zhu, Beijing (CN); Mingxing Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/580,446

(22) Filed: Sep. 24, 2019

(65) Prior Publication Data
US 2020/0019002 A1 Jan. 16, 2020

Related U.S. Application Data

(63) Continuation-in-part of application No. PCT/CN2018/115742, filed on Nov. 15, 2018.

(30) Foreign Application Priority Data

Jan. 2, 2018 (CN) .......................... 201810001704.9

(51) Int. Cl.
*G02F 1/01* (2006.01)
*G02F 1/1335* (2006.01)
(Continued)

(52) U.S. Cl.
CPC ........ *G02F 1/1335* (2013.01); *H01L 27/3232* (2013.01); *H01L 51/5203* (2013.01); *H01L 2251/308* (2013.01)

(58) Field of Classification Search
CPC .... G02F 1/0102; G02F 1/0121; G02F 1/1335; G02F 1/19; G02F 2001/133342;
(Continued)

(56) References Cited

U.S. PATENT DOCUMENTS 5,645,758 A * 7/1997 Kawasumi .............. G02F 1/132
252/299.01
9,482,885 B2 11/2016 Joo et al.
(Continued)

FOREIGN PATENT DOCUMENTS

CN 102751307 A 10/2012
CN 105206644 A 12/2015
(Continued)

OTHER PUBLICATIONS

International Search Report and Written Opinion issued in International Application No. PCT/CN2018/115742, dated Jan. 17, 2019, with English translation.
(Continued)

*Primary Examiner* — Ram A Mistry
(74) *Attorney, Agent, or Firm* — McDermott Will and Emery LLP

(57) ABSTRACT

A display panel includes: a transparent display substrate; an opposite substrate disposed opposite to the transparent display substrate; and a light adjusting layer disposed between the transparent display substrate and the opposite substrate. The light adjusting layer is configured in a way that, under action of an electric field, at least a part of the light adjusting layer transmits light or at least a part of the light adjusting layer reflects light.

15 Claims, 6 Drawing Sheets

(51) Int. Cl.
*H01L 27/32* (2006.01)
*H01L 51/52* (2006.01)

(58) Field of Classification Search
CPC ........... G02F 2201/44; H01L 2251/308; H01L 27/3232; H01L 51/5203
See application file for complete search history.

(56) References Cited

U.S. PATENT DOCUMENTS

| | | | |
|---|---|---|---|
| 10,394,069 B2 * | 8/2019 | Yamazaki | G02F 1/133514 |
| 2014/0320782 A1 * | 10/2014 | Uhm | G02F 1/1503 349/62 |
| 2017/0200424 A1 * | 7/2017 | Xu | H01L 27/3232 |
| 2017/0269450 A1 | 9/2017 | Huang et al. | |
| 2018/0129086 A1 * | 5/2018 | Ohtake | G02F 1/1343 |
| 2018/0149891 A1 | 5/2018 | Xu | |
| 2020/0019002 A1 | 1/2020 | Sun et al. | |

FOREIGN PATENT DOCUMENTS

| | | |
|---|---|---|
| CN | 105576006 A | 5/2016 |
| CN | 105589265 A | 5/2016 |
| CN | 205992531 U | 3/2017 |
| CN | 108231844 A | 6/2018 |

OTHER PUBLICATIONS

First Office Action issued in corresponding Chinese Application No. 201810001704.9, dated Feb. 2, 2019, with English translation.
Second Office Action issued in corresponding Chinese Application No. 201810001704.9, dated Jun. 27, 2019, with English translation.
Third Office Action issued in corresponding Chinese Application No. 201810001704.9, dated Dec. 20, 2019, with English translation.

* cited by examiner

US 11,079,622 B2

DISPLAY PANEL HAVING REFLECTORS IN LIGHT ADJUSTING LAYER AND DRIVE METHOD THEREOF

CROSS-REFERENCE TO RELATED APPLICATION

This application is a Continuation in part of Application of PCT/CN2018/115742 filed on Nov. 15, 2018, which claims priority to Chinese Patent Application No. 201810001704.9, filed with the Chinese Patent Office on Jan. 2, 2018, titled "DISPLAY PANEL AND DRIVING METHOD THEREOF", which are incorporated herein by reference in their entirety.

TECHNICAL FIELD

The present disclosure relates to the field of display technologies, and in particular, to a display panel and a driving method thereof.

BACKGROUND

When a transparent display device displays images, the image contents may be displayed on both a front surface and a back surface of the transparent display device, and the user can see the scene behind the device through the screen of the device, which may enhance the sense of reality and thus the transparent display device attracts extensive attention.

SUMMARY

In one aspect, some embodiments of the present disclosure provide a display panel, and the display panel includes: a transparent display substrate; an opposite substrate disposed opposite to the transparent display substrate; and a light adjusting layer disposed between the transparent substrate and the opposite substrate. The light adjusting layer is configured in a way that, under action of an electric field, at least a part of the light adjusting layer transmits light or at least a part of the light adjusting layer reflects light.

Optionally, the light adjusting layer includes a transparent filler and reflectors dispersed in the transparent filler. The reflectors are configured to be arranged in a direction parallel to a direction of the electric field under the action of the electric field.

Optionally, the reflectors are sheet-shaped reflectors, and the reflectors are configured in a way that plane directions of the reflectors are parallel to the direction of the electric field under the action of the electric field.

Optionally, the display panel further includes first driving electrodes and second driving electrodes spaced apart on a side of the opposite substrate facing the transparent display substrate. The first driving electrodes and the second driving electrodes are all made of a transparent conductive material.

Optionally, the first driving electrodes and the second driving electrodes are configured to form first electric fields, and a direction of the first electric fields is parallel to a plane direction of the transparent display panel.

Optionally, the first driving electrodes and the second driving electrodes are disposed in a same layer.

Optionally, the transparent display substrate includes a plurality of display units arranged in an array. The opposite substrate has a plurality of sub-regions corresponding to the plurality of display units, and the display panel includes a first driving electrode and a second driving electrode in each sub-region.

Optionally, the transparent display substrate further includes a transparent cover plate. The plurality of display units are disposed on a side of the transparent display substrate facing the opposite substrate. Each display unit includes a first transparent electrode, a light-emitting functional layer and a second transparent electrode which are away from the transparent cover plate in sequence. The opposite substrate is a transparent array substrate. The opposite substrate includes a driving unit in each sub-region, and the driving unit is configured to control a corresponding display unit to emit light.

Optionally, the transparent display substrate further includes: a transparent cover plate, and first transparent electrodes, light-emitting functional layers and second transparent electrodes that are disposed on a side of the transparent cover plate facing the opposite substrate in sequence. The first transparent electrodes and the second transparent electrodes are disposed crosswise, and the light-emitting functional layers are located in regions where the first transparent electrodes and the second transparent electrodes are crossed. The light-emitting functional layers, the first transparent electrodes and the second transparent electrodes form the display units. The opposite substrate is a transparent base.

Optionally, at least one of a first driving electrode and a second driving electrode is configured to form a second electric field together with a corresponding second transparent electrode. A direction of the second electric field is perpendicular to the plane direction of the transparent display substrate.

Optionally, the reflectors are graphene oxide sheets.

Optionally, a thickness of the light adjusting layer is 2 μm to 5 μm.

Optionally, the display panel further includes supporters disposed between the transparent display substrate and the opposite substrate.

Optionally, the display panel further includes a sealant disposed between the transparent display substrate and the opposite substrate, and the sealant is configured to seal the light adjusting layer.

In another aspect, some embodiments of the present disclosure provide a driving method of the display panel mentioned above. The driving method includes controlling at least a part of the light adjusting layer to transmit light via an electric field or at least a part of the light adjusting layer to reflect light via an electric field.

As an alternative manner, controlling at least a part of the light adjusting layer to transmit light via an electric field or at least a part of the light adjusting layer to reflect light via an electric field, includes: forming first electric fields between first driving electrodes and second driving electrodes, and a direction of the first electric fields being parallel to a plane direction of the transparent display substrate.

As another alternative manner, controlling at least a part of the light adjusting layer to transmit light via an electric field or at least a part of the light adjusting layer to reflect light via an electric field, includes: forming second electric fields between second transparent electrodes in the transparent display substrate and at least one kind of electrodes of the first driving electrodes and the second driving electrodes, a direction of the second electric fields being perpendicular to the plane direction of the transparent display substrate.

BRIEF DESCRIPTION OF THE DRAWINGS

In order to describe technical solutions in embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

When a transparent display device serves as, for example, a window (e.g., a billboard) of a building or a vehicle, to display images, the transparent display device displays the images on both sides due to its high transparency, which causes lack of a function of privacy display. The transparent display device may not realize free switching in different demand modes, i.e., a private display mode and a transparent display mode, during users' use.

Some embodiments of the present disclosure provide a display panel as a transparent display device, which will be described in detail below. In some embodiments of the present disclosure, unless otherwise defined, all terms (including technical and scientific terms) used in some embodiments of the present disclosure have the same meaning as commonly understood by those skilled in the art to which this disclosure belongs. It will also be understood that terms such as those defined in the ordinary dictionary should be interpreted as having meanings consistent with their meaning in the context of the related art, and not interpreted in an idealized or extremely formalized meaning unless explicitly defined herein.

For example, the terms "first", "second" and the like used in some embodiments of the present disclosure are not intended to mean any order, quantity or importance, and are merely used to distinguish different components. The words "include" or "comprise", etc. are intended to mean that an element or object that precedes the word includes an element or object listed after the word and equivalents thereof, and does not exclude other element or object. Orientations or positional relationships indicated by terms "upper/above" "lower/below" "row/row direction", "column/column direction" and so on are based on orientations or positional relationships shown in the accompanying drawings, which are merely the simplified descriptions for the convenience of describing the technical solutions of the present disclosure, but not to indicate or imply that the referred devices or elements must have a particular orientation, or must be constructed or operated in a particular orientation. Therefore they should not be construed as limitations to the present disclosure.

Figure 1A:
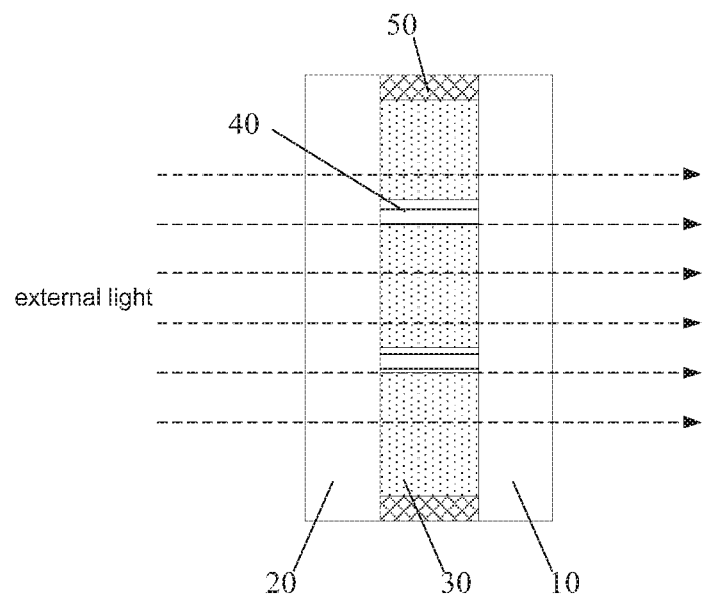
FIG. 1(a) is a schematic diagram showing a structure of a display panel in a transparent display mode, in accordance with some embodiments of the present disclosure.
Figure 1B:
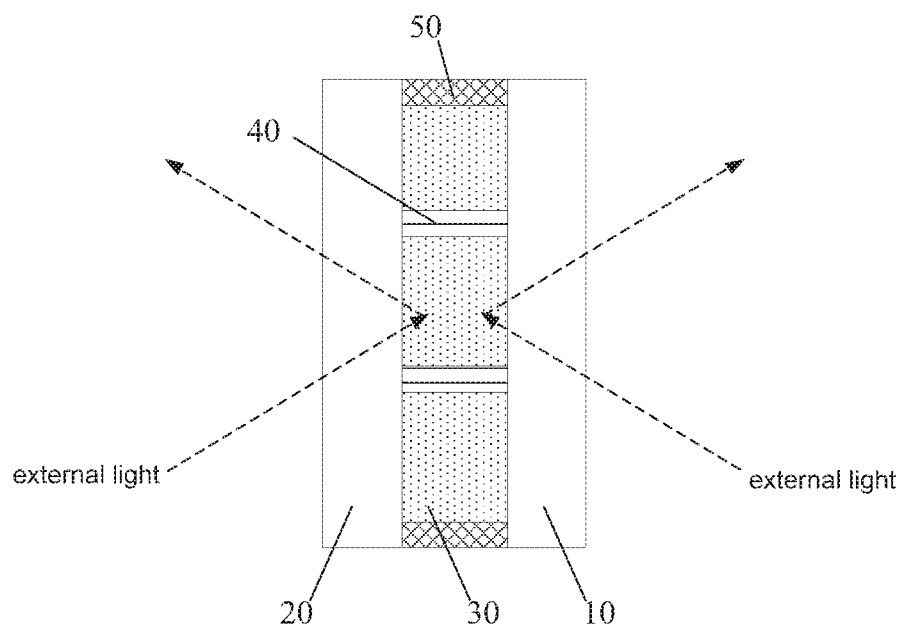
FIG. 1(b) is a schematic diagram showing a structure of a display panel in a private display mode, in accordance with some embodiments of the present disclosure.
Figure 1C:
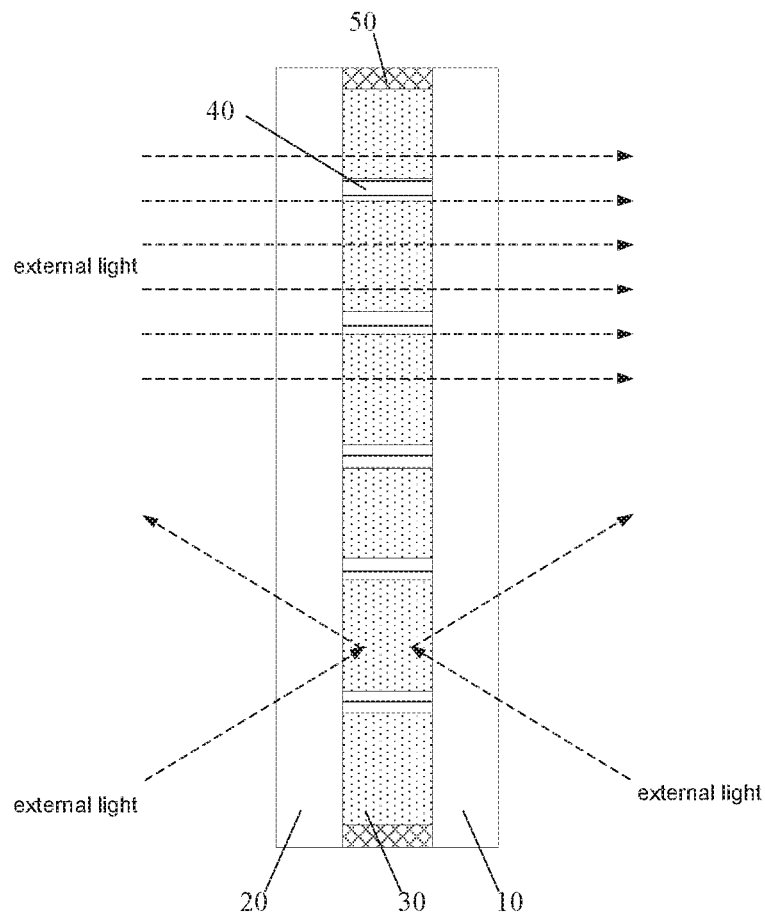
FIG. 1(c) is a schematic diagram showing a structure of a display panel in a partially transparent display and partially private display mode, in accordance with some embodiments of the present disclosure.

As shown in FIG. 1(a) to FIG. 1(c), some embodiments of the present disclosure provide a display panel, and the display panel includes a transparent display substrate 10 and an opposite substrate 20 disposed opposite to each other, and a light adjusting layer 30 disposed between the transparent display substrate 10 and the opposite substrate 20. The light adjusting layer 30 is configured in a way that, under the action of an electric field, at least a part of the light adjusting layer transmits light or at least a part of the light adjusting layer reflects light.

Light emitted from a light-emitting region (for example, light-emitting functional layers described below) of the transparent display substrate 10 may be emitted from a side of the transparent display substrate proximate to the light adjusting layer 30 and a side of the transparent display substrate away from the light adjusting layer 30.

Referring to FIG. 1(a), in a case where the light adjusting layer 30 may transmit light under the action of the electric field, light emitted from the transparent display substrate 10 may passes through the light adjusting layer 30 and the opposite substrate 20, so that the users may simultaneously view images displayed on the transparent display substrate 10 (for example, by mirroring an image displayed, a normal image is displayed on the one side, a mirror image is displayed on the other side) on both sides that are respectively proximate to the transparent display substrate 10 and the opposite substrate 20. The external light may also pass through the transparent display substrate 10, the light adjusting layer 30 and the opposite substrate 20, so that the user may see the scene behind the display panel, thereby achieving a transparent display effect.

The term "behind" as used herein and hereinafter is only used to describe a side of the overall display panel away from the user, and is not limited to a side of the transparent display substrate 10 or a side of the opposite substrate 20 unless otherwise specified.

Referring to FIG. 1(b), in a case where the light adjusting layer 30 may reflect light under the action of the electric field, a part of the light emitted from the transparent display substrate 10 is directly emitted from a side of the transparent display substrate away from the light adjusting layer 30, and another part of the light is reflected by the light adjusting layer 30 and is then emitted from the side of the transparent display substrate away from the light adjusting layer 30. Thus, the user located at a side proximate to the opposite substrate 20 may not see the images displayed on the transparent display substrate 10, and the user at the side proximate to the transparent display substrate 10 may perform operations such as entering a password on the transparent display substrate 10, so as to prevent personal information from leaking out. Since the external light may not pass through the light adjusting layer 30, the user may not see the scene behind the display panel while viewing the images displayed on the transparent display substrate 10, thereby achieving the private anti-peep display effect.

Moreover, since a part of the light emitted from the transparent display substrate 10 is emitted from the side of the transparent display substrate 10 away from the light adjusting layer 30 after being reflected by the light adjusting layer 30, when the intensity of the external ambient light of the display panel is relatively high, the effect of the reflective display may also be achieved, that is, the display brightness of a side of the transparent display substrate 10 which is used as a single-sided screen is effectively improved, thereby improving the quality of the display image.

Referring to FIG. 1(c), under the action of the electric field, a part of the light adjusting layer 30 may transmit light and another part thereof may reflect light. The working modes may refer to the working modes when the light adjusting layer 30 integrally transmits light and integrally reflects light that are respectively shown in FIG. 1(a) and FIG. 1(b), which will not be described again herein. By adjusting the electric field to control a part of the light adjusting layer 30 to transmit light and another part thereof to reflect light, a partially private display and a partially transparent display of the display panel may be realized.

In the display panel provided in some embodiments of the present disclosure, by adjusting the electric field to control the light adjusting layer 30 to transmit light or reflect light, the free switching between the privacy display mode and the transparent display mode under different users' demands may be achieved, or the coexistence of the privacy display mode and the transparent display mode may be achieved, so that display panel has the anti-peep display function and a variety of display modes, thereby improving users' experience.

In some embodiments of the present disclosure, the light adjusting layer 30 includes a transparent filler and reflectors dispersed in the transparent filler. The reflectors are configured in a way that long axes of the reflectors are arranged parallel to a direction of the electric field under the action of the electric field.

Optionally, the transparent filler may be a transparent liquid injected into a space between the transparent display substrate 10 and the opposite substrate 20, so that the reflectors are freely deflected in the transparent liquid under the action of the electric field force. In some examples, the transparent liquid is a deionized (DI) water or a low concentration solution such as a low concentration NaCl solution, a low concentration KCl solution, or a low concentration KOH solution.

Figure 2:
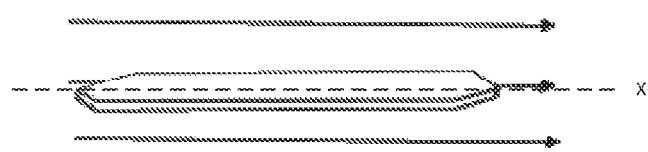
FIG. 2 is a schematic diagram showing a graphene oxide sheet disposed in a direction of an electric field.

The reflector may be a two-dimensional conductive material, such as a graphene oxide sheet. A micro-structure of the graphene oxide sheet is a sheet-shaped two-dimensional structure as shown in FIG. 2, and a thickness of the graphene oxide sheet is neglected as the thickness is extremely small. A long axis X of the graphene oxide sheet is deflected in the direction (as indicated by the arrow in FIG. 2) of the electric field, and in a microscopic state, a plane direction of the graphene oxide sheet is parallel to the direction of the electric field. The plane direction of the graphene oxide sheet refers to the plane of the graphene oxide sheet, i.e., the plane of the graphere oxide sheet itself is parallel to the direction of the electric field. In this case, the graphene oxide sheet is in equilibrium in the electric field.

Therefore, the direction of the sheet-shaped graphene oxide sheet may be controlled by changing the direction of the applied electric field, thereby controlling the light transmission property, so that the light adjusting layer 30 exhibits different effects of transmitting light or reflecting light.

For example, a Brodie method, a Staudenmaier method, and Hummers methods may be used to manufacture single-layer graphene oxide sheets, then the single-layer graphene oxide sheets are dispersed to the transparent liquid, so as to prepare a suspension including the single-layer graphene oxide sheets, and the Hummers methods include an improved Hummers method, an ultrasound-assisted Hummers method, etc.

Compared with graphene, the graphene oxide has oxygen functional groups in its structure. The oxygen functional groups may form $sp^3$ electron orbits, which affects $sp^2$ electron orbits formed between carbon atoms in the main structure of the graphene. The carbon atoms are divided into macromolecules of carbon clusters of different sizes by the oxygen functional groups added, which have a significant influence on the interaction between the carbon atoms and the electron transporting property.

Moreover, there are certain carboxyl and hydroxyl groups on the plane of the graphene oxide sheet. After the hydrolysis of the carboxyl and hydroxyl groups, the surfaces of the molecules have certain negative charges, and the electrostatic repulsion among molecules may cause the graphene oxide sheets in the liquid to appear a nematic phase.

The graphene oxide sheet has the following performance due to the above characteristics. When the applied electric field is applied to the graphene oxide sheet, a surface current may be produced on the surface of the graphene oxide sheet along the direction of the long axis X, and the graphene oxide sheet is deflected under the electric field force and finally stabilized when a direction of its long axis is parallel to the electric field. That is, the graphene oxide sheet is arranged in such a manner that its plane direction is parallel to the direction of the electric field.

In this way, by changing the direction of the electric field, the two-dimensional conductive materials may be arranged in different ways to achieve different effects of light transmission (i.e., passing) or reflection (i.e., blocking).

For example, when the direction of the electric field is perpendicular to the plane direction of the display panel (the plane direction of the display panel refers to the plane of the display panel), that is, the electric field is a vertical electric field, the graphene oxide sheets in the transparent filler are deflected in a way that the plane directions of the graphene oxide sheets are perpendicular to the transparent display substrate. Since the dimension in the thickness direction of the graphene oxide sheet is smaller as compared with the dimension in the sheet-shaped plane direction, light may be emitted between the graphene oxide sheets in a vertical direction of arrangement of the graphene oxide sheets, thereby achieving the effect that the light is allowed to pass through the light adjusting layer 30.

When the direction of the electric field is parallel to the plane direction of the display panel, that is, the electric field is a horizontal electric field, the graphene oxide sheets in the transparent filler are deflected in a way that the plane directions of the graphene oxide sheets are parallel to the transparent display substrate. Since the graphene oxide sheet itself is opaque, the light is reflected when light is irradiated onto the sheet-shaped plane of the graphene oxide sheet, thereby achieving the effect that the light adjusting layer 30 reflects light.

The thickness of the light adjusting layer 30 is, for example, 2 µm to 5 µm. For example, the thickness of the light adjusting layer 30 is 2 µm, 3 µm, 4 µm, or 5 µm. When the display panel is not in operation, the reflectors (for example, graphene oxide sheets) dispersed in the transparent filler are randomly arranged since the reflectors are not subjected to the action of the electric field, thereby causing light to pass between some of reflectors, and the thickness of the light adjusting layer 30 is thin, so the light adjusting layer 30 may exhibit a certain transparency. Since each layer in the transparent display substrate 10 and the opposite substrate 20 is composed of transparent or translucent film(s), the display panel as a whole has a higher transparency, and serves as a window in display scenes, such as an indoor window and a window of a vehicle.

Referring to any one of FIGS. 1(a) to 1(c), the display panel in some embodiments of the present disclosure further includes supporters 40 disposed between the transparent display substrate 10 and the opposite substrate 20, and a sealant 50 configured to seal the light adjusting layer 30. For example, the materials of the supports are photoresist materials, such as Resin polymer materials. The sealant 50 is, for example, a UV curing type sealant, such as, a mixture of photocurable resin, UV initiator, etc., or a heat curing type sealant, such as, a mixture of epoxy resin, catalyst and catalyst solvent. Since the transparent filler in the light adjusting layer 30 may be a transparent liquid and thus the light adjusting layer 30 is liquid as a whole, in order to support the transparent display substrate 10 and the opposite substrate 20 that are disposed at both sides of the liquid light adjusting layer 30, the supporters 40 and the sealant 50 are provided. For example, the supporters 40 are uniformly dispersed in a space between the transparent display substrate 10 and the opposite substrate 20, and the sealant 50 is disposed around the entire light adjusting layer 30.

For example, the transparent display substrate 10 is a self-luminous organic light-emitting display (referred briefly to as OLEO) substrate in which electrode structures such as an anode and a cathode are disposed. In order to avoid a mutual interference between the electric field for controlling the light transmission property of the light adjusting layer 30 and an electric field, which is between the anode and the cathode, for driving the OLEO to display, in some embodiments of the present disclosure, the electrode structures for forming the electric field for controlling are disposed on the opposite substrate 20, as shown in FIG. 3.

Figure 3:
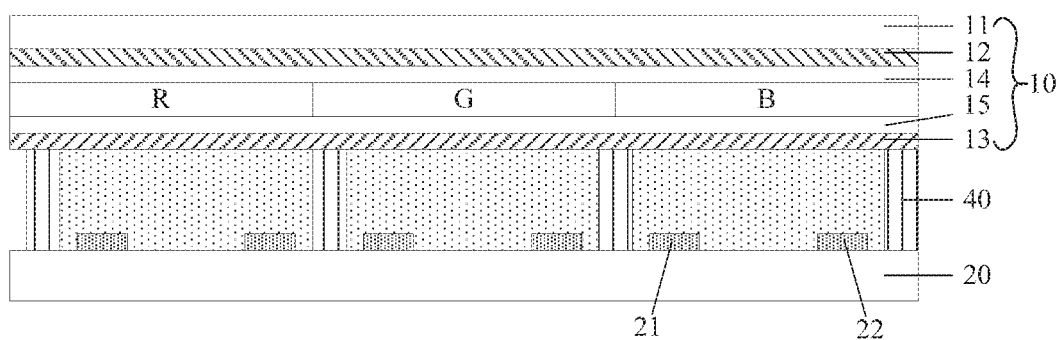
FIG. 3 is a schematic diagram showing a structure of one display unit of a display panel, in accordance with some embodiments of the present disclosure.

With continuous reference to FIG. 3, the display panel further includes first driving electrodes 21 and second driving electrodes 22 that are spaced apart from each other on a surface of the opposite substrate 20 proximate to the transparent display substrate 10. The first driving electrodes 21 and the second driving electrodes 22 are all made of a transparent conductive material (such as indium tin oxide). The first driving electrode 21 and the second driving electrode 22 form an electric field. In some embodiments of the present disclosure, the first driving electrodes 21 and the second driving electrodes 22 extend along the length direction of the display panel.

Moreover, the first driving electrode 21 and the second driving electrode 22 are disposed in a same layer on the opposite substrate 20, thereby forming a horizontal electric field parallel to the plane direction of the display panel. Since the first driving electrode 21 and the second driving electrode 22 may be flat-plate electrodes and the size of both in a width direction is much smaller than the spacing between them, the electric field formed in a space between the first driving electrode and the second driving electrode is negligible, and the first driving electrode and the second driving electrode form a non-uniform electric field to control the parallel arrangement of the reflectors. For example, a graphene oxide sheet is in the non-uniform electric field formed by the first driving electrode 21 and the second driving electrode 22, and all points on the plane of the graphene oxide sheet are deflected by subjecting to different electric field forces due to different electric field strengths, and finally the graphene oxide sheet is in equilibrium, that is, in a state in which the potentials at all points on the plane of the graphene oxide sheet are the same or the plane thereof is parallel to the plane of the transparent display substrate 10.

In a case where the opposite substrate 20 further includes other layers such as the array structure layer, the first driving electrode 21 and the second driving electrode 22 may also be disposed in different layers to form a field similar to a fringe field of the advanced super dimensional switching (referred briefly to as ADS) liquid crystal display panel, so as to control at least a part of the reflectors to be arranged in parallel.

Therefore, in order to enable the light adjusting layer 30 to achieve the effect of complete reflection, with reference to FIG. 3, the first driving electrode 21 and the second driving electrode 22 are disposed in the same layer, and the first driving electrode 21 and the second driving electrode 22 are configured to form a first electric field. A direction of the first electric field is parallel to a plane direction of the transparent display substrate 10, that is, a transverse horizontal electric field, so as to control reflectors in the transparent filler to be arranged along a direction parallel to the plane direction of the transparent display substrate. The plane direction of the transparent display substrate 10 refers to a plane of the transparent display substrate 10.

The arrangement manner of the same layer includes, but is not limited to, the manner in which the first driving electrode and the second driving electrode are disposed on an outermost surface of the opposite substrate 20 proximate to the light adjusting layer 30 shown in FIG. 3. Both the first driving electrode 21 and the second driving electrode 22 are in the same layer and a transverse horizontal electric field is formed between them.

In some embodiments of the present disclosure, as shown in FIG. 3, the transparent display substrate 10 includes a plurality of display units arranged in an array. The opposite substrate 20 opposite to the transparent display substrate 10 is divided into a plurality of sub-regions, which are corresponding to the display units. Each sub-region is provided with a first driving electrode 21 and a second driving electrode 22, that is, a pair of electrodes are disposed in each sub-region.

In this way, on the one hand, the first driving electrodes 21 and the second driving electrodes 22 may be evenly distributed on the entire opposite substrate 20, so as to provide a more uniform horizontal electric field for the light adjusting layer 30. On the other hand, according to the specific requirement of the user, voltages are respectively applied to first driving electrodes 21 and second driving electrodes 22 in a preset region, that is, only a horizontal electric field is formed in the preset region, so that only a portion of the light adjusting layer 30 corresponding to the preset region may achieve light reflection, and a portion of the light adjusting layer 30 corresponding to the remaining regions may still transmit light.

For example, the preset region may be a setting region for entering a password on the transparent display substrate 10, so as to prevent information from leaking out when the password is entered by the user, without affecting the normal transparent display of the remaining regions on the transparent display substrate 10. Therefore, the users on both sides of the display panel may obtain corresponding viewing experience, which further expands the application scene of the transparent display panel.

Figure 8:
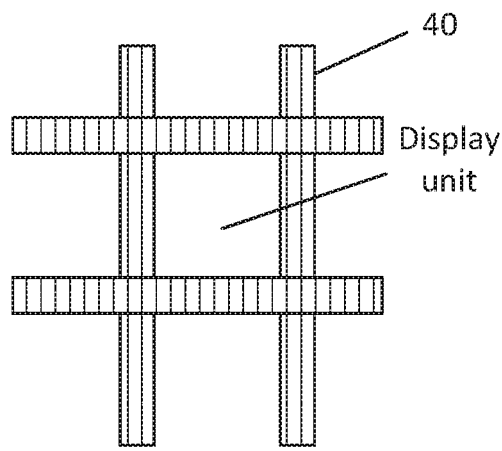
FIG. 8 is a schematic diagram showing an arrangement of supports, in accordance with some embodiments of the present disclosure.
Figure 9:
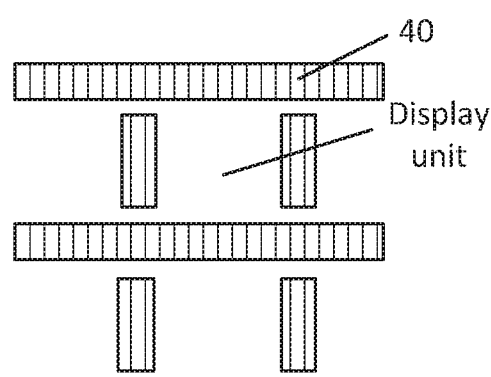
FIG. 9 is a schematic diagram showing another arrangement of supports, in accordance with some embodiments of the present disclosure.
Figure 10:
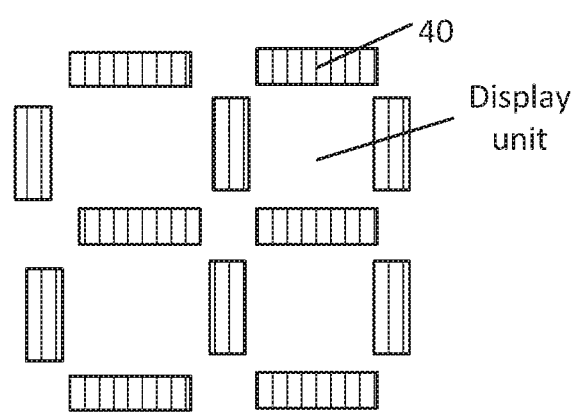
FIG. 10 is a schematic diagram showing another arrangement of supports, in accordance with some embodiments of the present disclosure.
Figure 11:
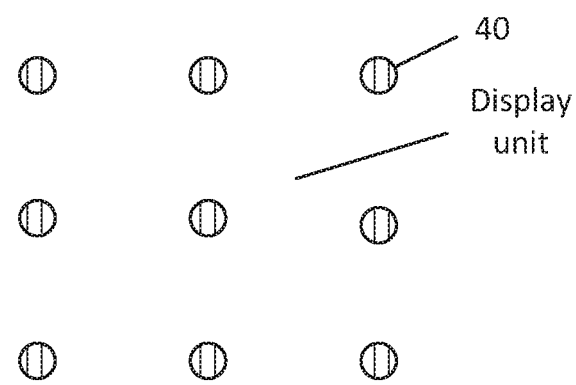
FIG. 11 is a schematic diagram showing another arrangement of supports, in accordance with some embodiments of the present disclosure.

In some examples, as shown in FIG. 8, the supports 40 are coupled to one another to surround the display units. In some examples, as shown in FIG. 9, some of the supports 40 are coupled to one another. In some examples, as shown in FIG. 10, the supports 40 are separated from each other, and four supports 40 surround a display unit. In some examples, as shown in FIG. 11, the supports 40 are cylindrical, and are distributed around the display units. Of course, the supports may be arranged in other ways, as long as the supports have the function of supporting.

Figure 7:
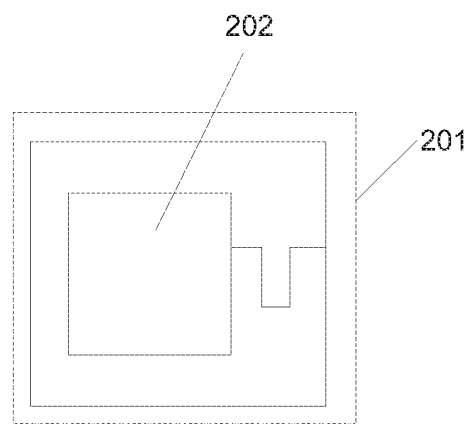
FIG. 7 is a schematic diagram of a driving unit, in accordance with some embodiments of the present disclosure.

In some embodiments of the present disclosure, the display panel is an active driving transparent display panel. Referring to FIG. 3, the transparent display substrate 10 further includes a transparent cover plate 11. The display units are disposed on a side of the transparent cover plate 11 proximate to the opposite substrate 20. Each display unit includes a first transparent electrode 12, light-emitting functional layers and a second transparent electrode 13 which are away from the transparent cover plate 11 in sequence. Correspondingly, the opposite substrate 20 is a transparent array substrate. As shown in FIG. 7, each sub-region 201 is provided with a driving unit 202, and the driving unit 202 is configured to control the display unit to emit light.

For example, the structure of the transparent array substrate may follow the related art, and the driving unit is a transparent or translucent thin film transistor (referred briefly to as TFT) that controls the display unit to emit light.

For example, the first transparent electrode 12 and the second transparent electrode 13 are mutually a cathode and an anode in the OLED device. Considering that in an active driving OLED device, the anode needs to be electrically connected to the drain in the driving unit to receive a corresponding display signal, in order to facilitate signal transmission, in some embodiments of the present disclosure, the second transparent electrode 13 proximate to the opposite substrate 20 is an anode, and the first transparent electrode 12 is a cathode.

Since the transparent display substrate 10 and the opposite substrate 20 are separated by the light adjusting layer 30, the second transparent electrode 13 (i.e., the anode) may be electrically connected to the driving unit in the opposite substrate 20 through a metal connection structure such as peripheral wiring, so as to receive the corresponding display signal.

With continuous reference to FIG. 3, taking the first transparent electrode 12 being the cathode and the second transparent electrode 13 being the anode as an example, the light-emitting functional layers may include, but are not limited to, the following structures: an electron injection layer/electron transport layer 14, a light-emitting layer and a hole-transporting layer/hole injection layer 15 sequentially away from the transparent cover plate 11.

The first transparent electrode 12 may use a thin transparent or translucent electrode, such as a magnesium-silver (Mg—Ag) alloy. The second transparent electrode 13 may use a transparent electrode, such as indium tin oxide (ITO). The electron injection layer/electron transport layer 14 may use an organic compound having a higher excited state level and a derivative material thereof. The hole-transporting layer/hole injection layer 15 may use an organic compound having a higher hole mobility and a lower free potential, and derivatives thereof, such as aromatic amines, carbazoles.

With continuous reference to FIG. 3, taking three adjacent display units being three sub-pixels R, G, and B as an example, and R, G, and B are respectively labeled as the light-emitting layers emitting red light, green light and blue light. Materials of R, G, and B light-emitting layers may be selected from organic small molecule materials or macromolecule materials.

In some embodiments of the present disclosure, the display panel may also be a passive driving transparent display panel with a relatively simple structure. For example, the transparent display substrate 10 further includes a transparent cover plate, and first transparent electrodes, light-emitting functional layers, and second transparent electrodes sequentially disposed on a side of the transparent cover plate proximate to the opposite substrate. The first transparent electrodes and the second transparent electrodes are disposed crosswise, and a light-emitting functional layer is disposed in a region where a first transparent electrode and a second transparent electrode are crossed. A light-emitting functional layer, a first transparent electrode and a second transparent electrode form a display unit. The opposite substrate 20 opposite to the transparent display substrate 10 is a transparent base, in which driving units are not provided.

For example, when the light adjusting layer 30 is required to transmit light, that is, achieving a normal transparent display, at least one of the first driving electrode 21 and the second driving electrode 22 on the opposite substrate 20 may be configured to form a second electric field together with the second transparent electrode 13 in the transparent display substrate 10. A direction of the second electric field is perpendicular to the plane direction of the transparent display substrate, that is, a vertical electric field is formed to control the reflectors in the transparent filler to be arranged along a direction perpendicular to the plane direction of the transparent display substrate. A complete transparent state of the display panel shown in FIG. 1(a) is achieved by adjusting the vertical electric field formed between the electrodes on both sides of the light adjusting layer 30 and passing through the light adjusting layer 30.

Examples are described in detail below by taking an example in which the reflectors are graphene oxide sheets and the transparent display substrate 10 is the ©LED substrate, for describing in detail the manner in which the modes of the display panel are freely switched under user's different requirements.

Figure 4:
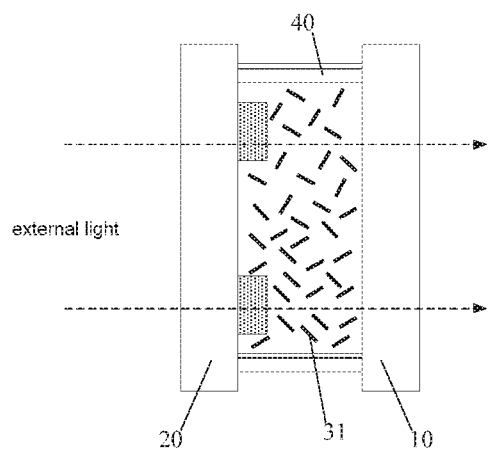
FIG. 4 is a schematic diagram of a display mode when a display panel is not working, in accordance with some embodiments of the present disclosure.

As shown in FIG. 4, when the display panel is not working, since a thickness of the light adjusting layer is thin, i.e., only 2 μm to 5 μm, the graphene oxide sheets 31 are arranged in a dispersed manner, and light may be transmitted through the light adjusting layer, so that the light adjusting layer exhibits a certain degree of transparency. Since each of layers in the transparent display substrate 10 and the opposite substrate 20 includes a transparent or translucent film, the display panel may exhibit a high transparency, and thus the display panel may be used as a window for the display scenes such as an indoor window, or a window of a vehicle.

Figure 5:
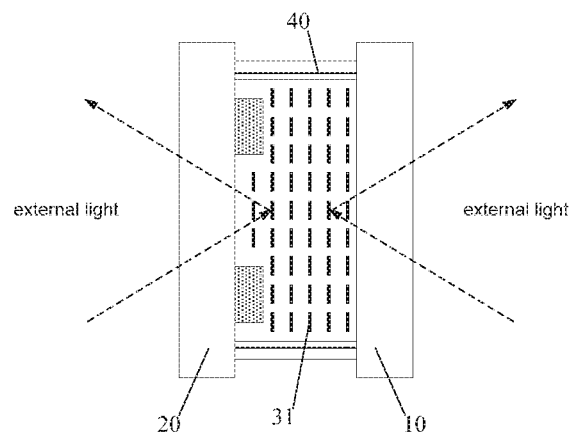
FIG. 5 is a schematic diagram of a private display mode of the display panel shown in FIG. 4.

As shown in FIG. 5, when the display panel is in operation, electric fields are formed between the first transparent electrodes 12 and the second transparent electrodes 13, so as to control the R, G, and B light-emitting layers to emit light, thereby achieving the display effect. Different voltages are applied to the first driving electrode 21 and the second driving electrode 22 to form the horizontal electric field therebetween, so that the surface of the graphene oxide sheet produces a surface current along the long axis direction, thereby causing deflection thereof. Thus, the graphene oxide sheets are stabilized in a direction parallel to the direction of the electric field, that is, the planes of the graphene oxide sheets in FIG. 5 are in parallel to the plane direction of the transparent display substrate 10.

Since the light adjusting layer 30 reflects light, a side (i.e., a front surface) of the display panel, at which the transparent display substrate 10 is located, is a visible side, and a side (i.e., a back surface), at which the opposite substrate 20 is located, is an invisible side. When viewing from the front surface, the brightness of the screen may be effectively improved, and the visual effect may be improved. When viewing from the back surface, the back surface exhibits a bright state due to the reflection of the light adjusting layer, so the image content displayed on the transparent display substrate 10 may not be viewed, thereby achieving anti-peep display effect.

Figure 6:
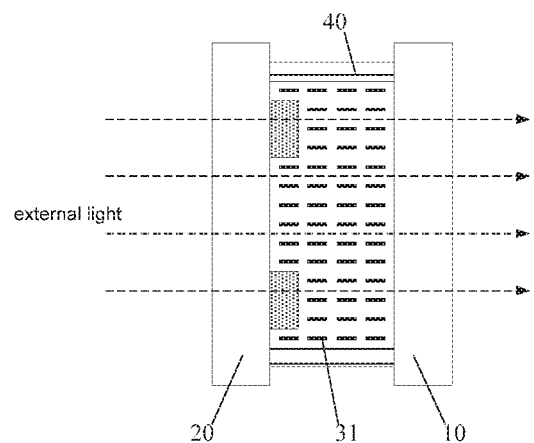
FIG. 6 is a schematic diagram of a transparent display mode of the display panel shown in FIG. 4.

As shown in FIG. 6, when the display panel is in operation, the electric fields are formed between the first transparent electrodes 12 and the second transparent electrodes 13, so as to control the R, G, and B light-emitting layers to emit light, thereby achieving the display effect. Meanwhile, when a same voltage is applied to the first driving electrode 21 and the second driving electrode 22, and a vertical electric field is formed between the first and the second driving electrodes 21, 22 and an adjacent second transparent electrode 13 in the transparent display substrate 10, the graphene oxide sheets 31 are vertically arranged along the direction of the electric field. That is, the graphene oxide sheets 31 are arranged along a direction perpendicular to the plane direction of the transparent display substrate 10. The external light may pass over the graphene oxide sheets 31, that is, the light adjusting layer is completely transparent. In this case, both sides of the display panel are visible sides.

Therefore, the formed horizontal electric field and vertical electric field may be used as a back display switch of the transparent display substrate 10, thereby achieving the free mode switching between transparent display and private display by adjusting the back display switch according to the users' specific requirements.

Some embodiments of the present disclosure provide a driving method of the above display panel, and the driving method includes: controlling at least a part of the light adjusting layer 30 to transmit light or at least a part of the light adjusting layer 30 to reflect light via an electric field, so as to realize a single-sided display or transparent display (displayed on both sides) of the display panel.

Optionally, a first electric field (i.e., a horizontal electric field) may be formed between the first driving electrode 21 and the second driving electrode 22, and a direction of the first electric field is parallel to a plane direction of the transparent display substrate 10, so as to control the reflectors in the transparent filler to be arranged along a direction parallel to the plane direction of the transparent display substrate 10, so that the light emitted from the transparent display substrate 10 is emitted from a side of the transparent display substrate proximate to the opposite substrate 20, and then is reflected by the reflectors, thereby realizing the single-sided display of the display panel.

Alternatively, a second electric field (i.e., a vertical electric field) is formed between the second transparent electrode 13 in the transparent display substrate 10 and at least one of the first driving electrode 21 and the second driving electrode 22, and a direction of the second electric field is perpendicular to the plane direction of the transparent display substrate 10, so as to control the reflectors in the transparent filler to be arranged along a direction perpendicular to the plane direction of the transparent display substrate, so that the light emitted from the transparent display substrate 10 is emitted from a side of the transparent display substrate proximate to the opposite substrate 20, and then passes through the light adjusting layer 30, so as to realize the transparent display of the display panel.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display panel, comprising:
a transparent display substrate;
an opposite substrate disposed opposite to the transparent display substrate; and
a light adjusting layer disposed between the transparent display substrate and the opposite substrate, wherein the light adjusting layer is configured in a way that, under action of an electric field, at least a part of the light adjusting layer transmits light or at least a part of the light adjusting layer reflects light; the light adjusting layer includes a transparent filler and graphene oxide sheets dispersed in the transparent filler, and the graphene oxide sheets are configured to be arranged in a direction parallel to a direction of the electric field under the action of the electric field.

2. The display panel according to claim 1, wherein the reflectors are sheet-shaped reflectors, and the reflectors are configured in a way that plane directions of the reflectors are parallel to the direction of the electric field under the action of the electric field.

3. The display panel according to claim 1, further comprising first driving electrodes and second driving electrodes spaced apart on a side of the opposite substrate facing the transparent display substrate, wherein
the first driving electrodes and the second driving electrodes are all made of a transparent conductive material.

4. The display panel according to claim 3, wherein the first driving electrodes and the second driving electrodes are configured to form first electric fields, and a direction of the first electric fields is parallel to a plane direction of the transparent display panel.

5. The display panel according to claim 4, wherein the first driving electrodes and the second driving electrodes are disposed in a same layer.

6. The display panel according to claim 3, wherein the transparent display substrate includes a plurality of display units arranged in an array;
the opposite substrate has a plurality of sub-regions corresponding to the plurality of display units, and the display panel includes a first driving electrode and a second driving electrode in each sub-region.

7. The display panel according to claim 6, wherein the transparent display substrate further includes a transparent cover plate;
the plurality of display units are disposed on a side of the transparent cover plate facing the opposite substrate;
each display unit includes a first transparent electrode, light-emitting functional layers and a second transparent electrode, and the first transparent electrode, the light-emitting functional layers and the second transparent electrode are arranged away from the transparent cover plate in sequence; and
the opposite substrate is a transparent array substrate; the opposite substrate includes a driving unit in each sub-region, and the driving unit is configured to control a corresponding display unit to emit light.

8. The display panel according to claim 7, wherein at least one of the first driving electrode and the second driving electrode is configured to form a second electric field together with a corresponding second transparent electrode;
a direction of the second electric field is perpendicular to a plane direction of the transparent display substrate.

9. The display panel according to claim 6, wherein the transparent display substrate further comprises a transparent cover plate, first transparent electrodes, light-emitting functional layers and second transparent electrodes, and the first transparent electrodes, the light-emitting functional layers and the second transparent electrodes are disposed on a side of the transparent cover plate facing the opposite substrate in sequence;
the first transparent electrodes and the second transparent electrodes are disposed crosswise, and the light-emitting functional layers are disposed in regions where the first transparent electrodes and the second transparent electrodes are crossed;
the light-emitting functional layers, the first transparent electrodes and the second transparent electrodes form the display units; and
the opposite substrate is a transparent base.

10. The display panel according to claim 1, wherein a thickness of the light adjusting layer is 2 μm to 5 μm.

11. The display panel according to claim 1, wherein the display panel further comprises supporters disposed between the transparent display substrate and the opposite substrate.

12. The display panel according to claim 1, wherein the display panel further comprises a sealant disposed between the transparent display substrate and the opposite substrate, and the sealant is configured to seal the light adjusting layer.

13. A driving method of the display panel according to claim 1, wherein the light adjusting layer includes a transparent filler and graphene oxide sheets dispersed in the transparent filler, and the graphene oxide sheets are configured to be arranged in a direction parallel to a direction of the electric field under the action of the electric field; and
the driving method comprising: controlling at least a part of the light adjusting layer to transmit light by an electric field or at least a part of the light adjusting layer to reflect light by an electric field.

14. The driving method according to claim 13, wherein controlling at least a part of the light adjusting layer to transmit light by an electric field or at least a part of the light adjusting layer to reflect light by an electric field, includes:
forming first electric fields between first driving electrodes and second driving electrodes, a direction of the first electric fields being parallel to a plane direction of the transparent display substrate.

15. The driving method according to claim 13, wherein controlling at least a part of the light adjusting layer to transmit light by an electric field or at least a part of the light adjusting layer to reflect light by an electric field, includes:
forming second electric fields between second transparent electrodes in the transparent display substrate and at least one kind of electrodes of first driving electrodes and second driving electrodes, a direction of the second electric fields being perpendicular to a plane direction of the transparent display substrate.

* * * * *